United States Patent [19]
Cohn

[11] Patent Number: 5,475,349
[45] Date of Patent: Dec. 12, 1995

[54] FREQUENCY MULTIPLIERS USING DIODE ARRAYS

[75] Inventor: Marvin Cohn, Baltimore, Md.

[73] Assignee: Westinghouse Electric Corp., Baltimore, Md.

[21] Appl. No.: 315,659

[22] Filed: Sep. 29, 1994

[51] Int. Cl.⁶ .................................................. H01P 1/20
[52] U.S. Cl. ................................... 333/218; 257/601
[58] Field of Search ............................... 333/164, 218; 257/312, 480, 595–602, 922; 343/909, 754; 327/586; 340/825.85–825.87, 825.94

[56] References Cited

U.S. PATENT DOCUMENTS

| | | | |
|---|---|---|---|
| 3,392,393 | 7/1968 | Spitz | 343/754 |
| 3,708,796 | 1/1973 | Gilbert | 343/909 X |
| 4,447,815 | 5/1984 | Chekroun et al. | 343/909 X |
| 5,148,182 | 9/1992 | Gautier et al. | 343/754 |
| 5,406,237 | 4/1995 | Ravas et al. | 333/218 |

*Primary Examiner*—Paul Gensler
*Attorney, Agent, or Firm*—Walter G. Sutcliff

[57] ABSTRACT

A frequency multiplier in which one or more varactors each include arrays of Schottky barrier diodes combined in rows of parallel-connected diodes and columns of series-connected diodes. The arrays are dispersed on a thermal substrate, or confined to a GaAs strip guide on a suitable substrate and in either case employed in various discrete-component or integrated circuit transmissions systems. These series-parallel arrays can be increased in size as desired for power handling capabilities or thermal dissipation and provide readily selectable impedance levels and breakdown voltages. These properties make the frequency multipliers useful in microwave and millimeter-wave systems, including those requiring high-power transmitters.

10 Claims, 3 Drawing Sheets

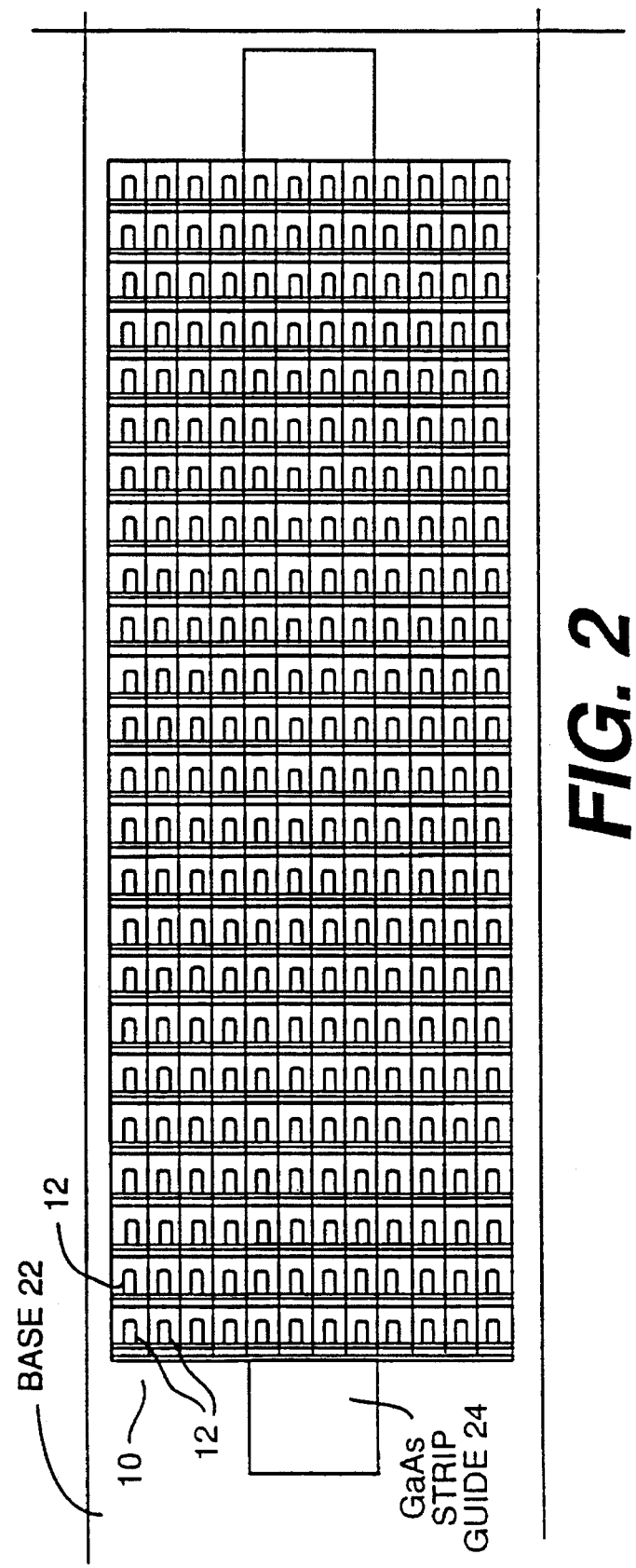

FREQUENCY MULTIPLIERS USING DIODE ARRAYS

BACKGROUND OF THE INVENTION

The present invention relates to frequency multipliers. More particularly, the present invention relates to frequency multipliers for use in microwave or millimeter wavelength circuits, especially in high power transmitter systems.

There are a number of microwave systems having transmitters operating at millimeter wavelengths, e.g., 94 GHz, that require peak power outputs up to tens of watts. Cost, size, and power constraints dictate that the transmitters used in these and other applications be inexpensive, small, and energy efficient.

Coherence requirements frequently preclude the use of diodes such as Gunn or IMPATT (Impact Ionization Avalanche Transit Time) diodes to generate power directly at frequencies such as 94 GHz. In addition, if these two-terminal devices are used as amplifiers rather than oscillators in a coherent system, they require additional costly, bulky devices, for example, a ferrite circulator and its associated magnet. Further, three terminal devices, such as HEMTs (High Electron Mobility Transistors) or pseudomorphic HEMTs (PHEMTs) with gate lengths down to 0.1 μm, have demonstrated useful gain at modest power levels at 94 GHz. There are, however, reliability concerns for such devices having short gate lengths and the typical low manufacturing yields increase their cost. Probably their most serious deficiency, however, is their low power output which in turn requires combining a large number of these devices to achieve the required power level. Unfortunately, power combining has generated substantial power loss and low efficiency.

Alternatively, high power millimeter wave transmitters may use a first stage having high power and efficiency by employing MESFET (Metal Semiconductor Field Effect Transistor) devices to generate the required power level at lower frequencies and a second stage having a frequency multiplier relying upon nonlinear elements such as varactors (voltage dependent capacitors) to generate the required millimeter wave frequency. In such a scheme, the frequency multiplier must have (1) high efficiency, (2) high power handling capability, and (3) good heat dissipation properties, and must be compact and manufacturable at low cost.

In addition to the aforementioned requirements, the characteristics of the frequency multiplier should facilitate design to yield input and output impedances appropriate to the circuit incorporating the frequency multiplier.

A single varactor capable of handling high power levels would require a large junction area. But, a large junction area corresponds to an extremely low impedance at millimeter wavelengths. This low impedance would result in unacceptable losses due to the addition of impedance matching input and output circuits. Furthermore, the varactor would have a narrow bandwidth and tuning would be critical. Others have addressed this characteristic of varactors (see P. W. Staecker et al., "Multi-Watt Power Generation at Millimeter-Wave Frequencies Using Epitaxially-Stacked Varactor Diodes," 1987 IEEE MTT-S Digest, pp. 917–920, Jun. 1987; J. F. Cushman et al., "High Power Epitaxially-Stacked Varactor Diode Multipliers: Performance and Applications at W-Band," 1990 IEEE MTT-S Digest, pp. 923–926, May 1990). Unfortunately, this type of structure is difficult to process and has poor thermal properties because only the bottom P-N junction varactor is in good thermal contact with the heat sink. As a result, the temperature rise of the upper P-N junctions can be hundreds of degrees greater than the bottom junction, resulting in different electrical characteristics among the P-N junctions.

In light of the foregoing, there is need for a frequency multiplier that is small and inexpensive and can handle high power with high efficiencies.

SUMMARY OF THE INVENTION

Accordingly, the present invention is directed to a frequency multiplier that substantially obviates one or more of the problems due to the limitations and disadvantages of the related art.

In accordance with the invention, it has been recognized that, to overcome the drawbacks of a single varactor used as a frequency multiplier, a plurality of interconnected varactor diodes of selected size can be used to achieve the required power handling capability and maintain an acceptable impedance level.

Additional features and advantages of the invention will be set forth in the description which follows, and in part will be apparent from the description, or may be learned by practice of the invention. The objectives and other advantages of the invention will be realized and attained by the frequency multiplier particularly pointed out in the written description and claims hereof as well as the appended drawings.

In accordance with an illustrative implementation of the invention, as embodied and broadly described herein, a frequency multiplier comprises a plurality of varactor diodes arranged in rows and columns to form a diode array, wherein all diodes of a particular row are connected in parallel and all columns are connected in series.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description serve to explain the principles of the invention.

BRIEF DESCRIPTION OF THE DRAWINGS

FIG. 2 is a plan view of a second embodiment of the invention employing a 12×24 Schottky barrier diode array.

DESCRIPTION OF THE PREFERRED EMBODIMENTS

Reference will now be made in detail to the present preferred embodiments of the invention, examples of which are illustrated in the accompanying drawings.

Figure 1:
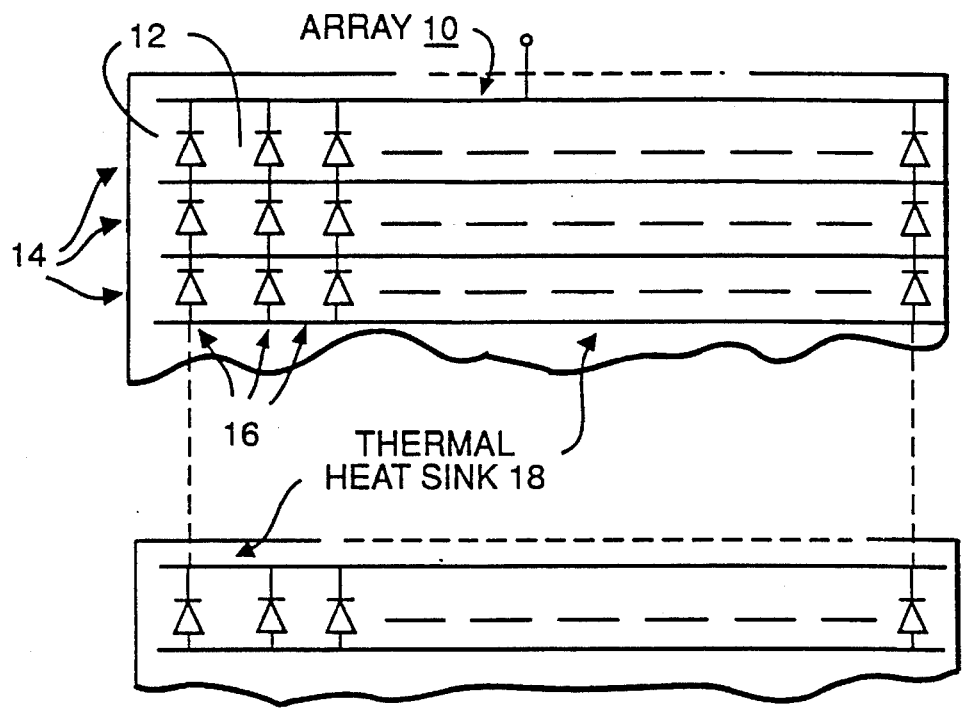
FIG. 1 is a schematic diagram of a first embodiment of the invention employing Schottky barrier diodes.

As seen in FIG. 1, a varactor array 10 providing a large effective junction area and a high impedance can be a diode array having a plurality of high-cutoff-frequency Schottky barrier diodes 12 in a series-parallel connection. The diodes 12 are combined in rows 14, in each of which diodes 12 are connected in parallel, and columns 16, in each of which diodes 12 are connected in series. The power handling capability of the array is determined by the combination of the junction areas of all the diodes 12 in the series/parallel diode array, and by the sum of the breakdown voltages of the series-connected constituent diodes 12 in a column 16. The impedance levels at the input frequency, output frequency, and possible idler frequencies are determined by the combination of the capacitances of diodes 12 in the series/parallel diode array. In rows, capacitances additively combine and in columns their elastances (reciprocal of capacitance) additively combine.

The varactors illustratively envisioned for high power frequency multipliers will have hundreds of individual diodes. For example, as seen in FIG. 2, the varactor 10 is a 12×24 array of Schottky barrier diodes 12. Such an array is compact, having dimensions that are a small fraction of a wavelength and comparable to the lateral dimensions of a GaAs microstrip waveguide 24 on a base 22. Thus, the array can be formed on an inexpensive monolithic microwave integrated circuit. This varactor 10 also has good thermal properties because all of the diodes 12 are thermally in parallel and are close to the thermal sink 18, as shown in FIG. 1. In addition, the individual diodes 12 are all dispersed on the thermal sink, reducing a temperature rise among the diodes 12. Since they are dispersed, the wiring connnections can be run between them as shown.

Figure 3:
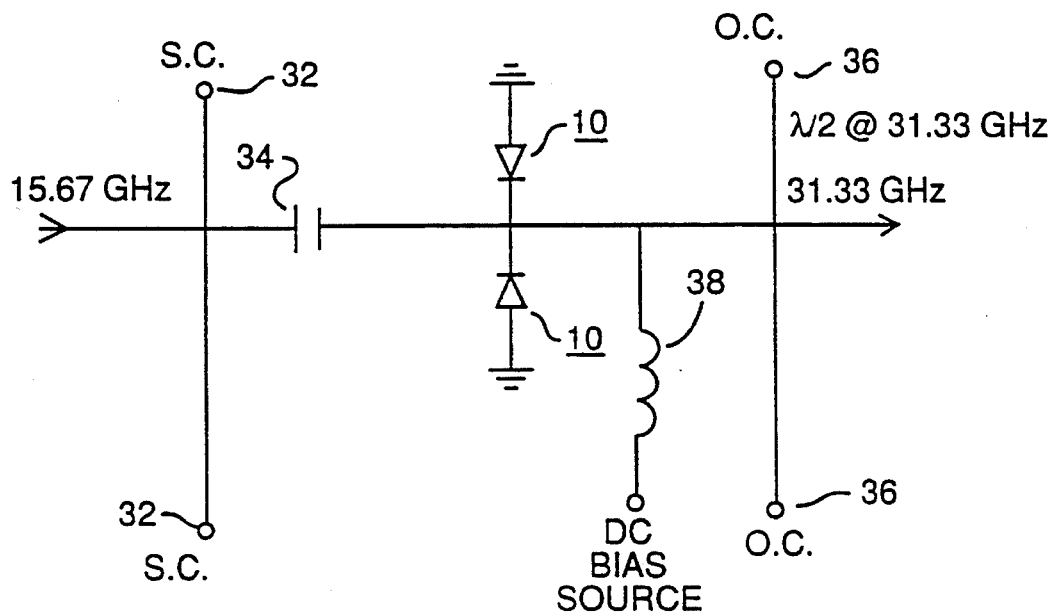
FIG. 3 is a schematic diagram of a preferred embodiment of the invention illustrating a frequency doubler multiplier circuit using two varactors of FIG. 2.

These varactors 10 can be incorporated in a frequency multiplier that is a monolithic microwave integrated circuit that becomes a frequency doubler circuit. For example, as seen in FIG. 3, a $K_u$ (15.67 GHz) to $K_a$ (31.33 GHz) frequency doubler incorporates two varactors 10. A 15.676 GHz signal is applied to the circuit. The circuit comprises two short circuit stubs 32 connected in parallel to the input means, a blocking capacitor 34, the two varactors 10 coupled in parallel to the blocking capacitor 34, two open-circuit stubs 36 connected in parallel to the varactors 10, a branch with an RF suppressing choke 38 to apply dc bias to the diode array, and means for outputting the frequency-doubled signal.

Figure 4:
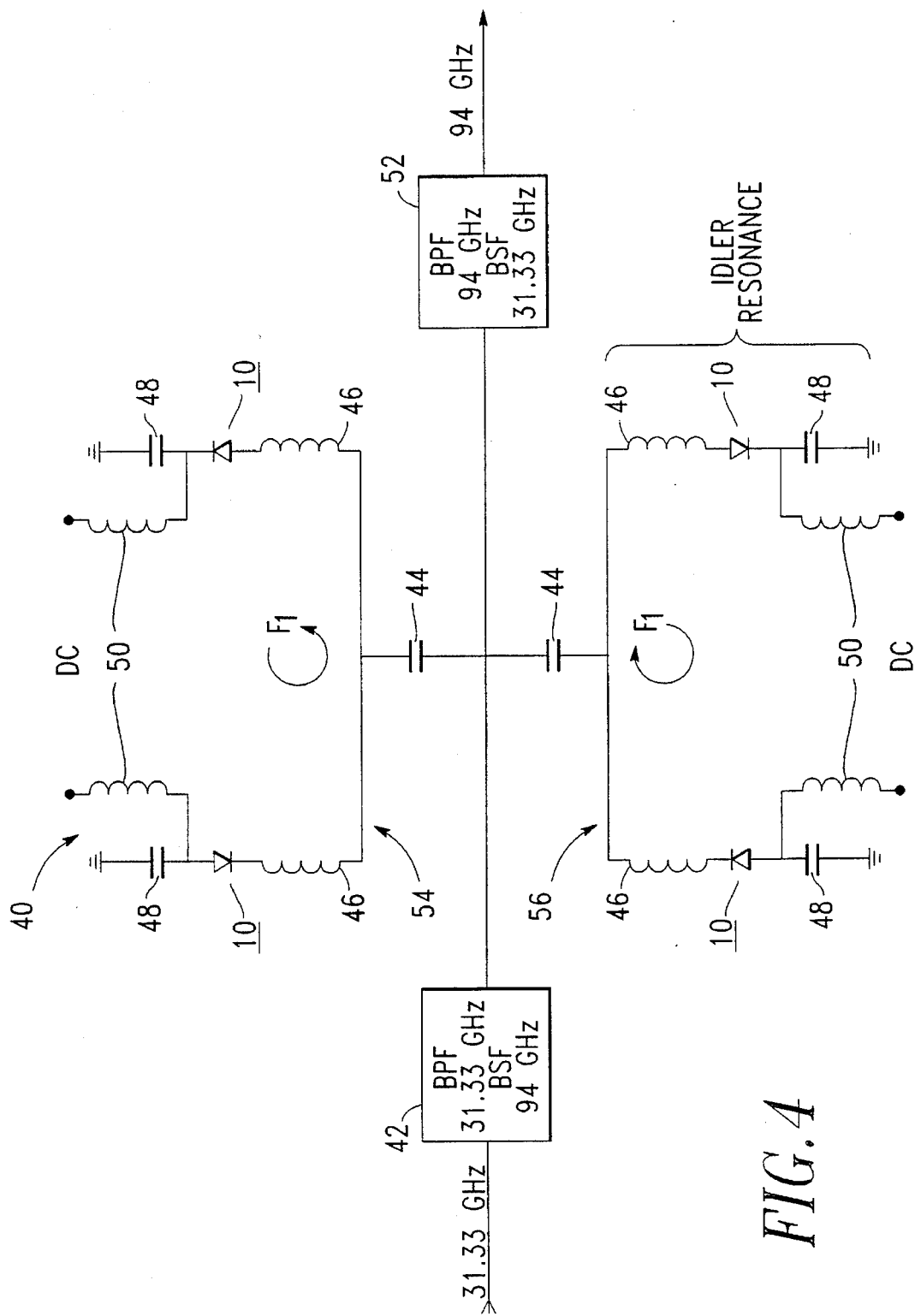
FIG. 4 is a schematic diagram of another embodiment of the invention illustrating a frequency tripler circuit using four varactors of FIG. 2.

As seen in FIG. 4, a $K_a$ band to 94 GHz frequency-tripling circuit 40 incorporates four varactors 10. In this latter case, the four varactors are part of a second harmonic (62.67 GHz) idler circuit 54, 56 that resonates the second harmonic generated during frequency tripling and increases the efficiency of the tripler. A 31.33 GHz signal is applied to the circuit through a filter 42 that has bandpass characteristics in the forward direction and bandstop characteristics in the reverse direction for the tripled frequency. Each idler circuit 54, 56 resonates at an idler frequency $f_i$=62.67 GHz and has a coupling capacitor 44 coupled in series with the parallel combination of its two legs. Each leg has a series-resonant circuit including an inductor 46, Schottky diode array device 10, and elements for applying dc bias including capacitor 48 and inductor 50 coupled in parallel.

The output of the frequency-tripling circuit 18 is coupled through 94 GHz bandpass filter 52, which also has a bandstop characteristic for the input frequency (31.33 GHz).

It will be apparent to those skilled in the art that various modifications and variations can be made in the frequency multipliers of the present invention and in their application in transmission circuits without departing from the scope or spirit of the invention. As an example, these frequency multipliers, including varactors comprised of series-parallel arrays of Schottky barrier diodes, can be used in other circuits requiring a nonlinear or voltage-controlled capacitance, tuners in high power oscillators, and high power analog phase shifters. Also, they can be incorporated as part of a monolithic microwave integrated circuit or they can be discrete components. In either case, they can be used in waveguide structures.

Other embodiments of the invention will be apparent to those skilled in the art from consideration of the specification and practice of the invention disclosed herein.

It is intended that the specification and examples be considered as exemplary only, with a true scope and spirit of the invention being indicated by the following claims.

I claim:

1. A frequency multiplier comprising:

a plurality of rows of varactor diodes, each row having a plurality of varactor diodes connected in parallel; and means for providing a plurality of columns of the varactor diodes, comprising means for aligning and connecting respective varactor diodes of each row in series, an array of varactor diodes thereby being formed.

2. The frequency multiplier according to claim 1, wherein the plurality of varactor diodes are Schottky barrier diodes.

3. The frequency multiplier according to claim 1, wherein the plurality of varactor diodes are dispersed on a heat-dissipating substrate.

4. The frequency multiplier according to claim 1, wherein the plurality of varactor diodes are selected and arrayed for frequency multiplication in the frequency range from $K_u$-band through the millimeter-wave band.

5. The frequency multiplier according to claim 1, wherein the plurality of varactor diodes are arrayed on a GaAs strip guide.

6. A frequency multiplier for multiplying a first microwave signal having a first frequency, comprising a waveguiding structure for transmitting electromagnetic energy of the first frequency;

a plurality of rows of varactor diodes coupled to said waveguiding structure, each row having a plurality of varactor diodes connected in parallel; and means for providing a plurality of columns of the varactor diodes, each column having a plurality of varactor diodes, comprising means for aligning and connecting respective varactor diodes of each row in series, an array of varactor diodes thereby being coupled to the waveguiding structure.

7. The frequency multiplier according to claim 6, wherein the plurality of varactor diodes are Schottky barrier diodes.

8. The frequency multiplier according to claim 6, wherein the waveguiding structure has a characteristic impedance; and the pluralities of varactor diodes in the rows and columns have respective numbers of the varactor diodes selected to provide substantial power transfer to and from the waveguiding structure.

9. The frequency multiplier according to claim 6, wherein the plurality of varactor diodes are dispersed on a heat sink.

10. The frequency multiplier according to claim 6, wherein the plurality of varactor diodes are mounted on a GaAs strip guide.

\* \* \* \* \*